(12) United States Patent
Orr

(10) Patent No.: US 6,758,353 B2
(45) Date of Patent: Jul. 6, 2004

(54) BLANK PANEL FOR RACK UNITS

(76) Inventor: David Orr, 128 Cronin Dr., Santa Clara, CA (US) 95051

( * ) Notice: Subject to any disclaimer, the term of this patent is extended or adjusted under 35 U.S.C. 154(b) by 0 days.

(21) Appl. No.: 09/839,567

(22) Filed: Apr. 19, 2001

(65) Prior Publication Data

US 2002/0153338 A1 Oct. 24, 2002

(51) Int. Cl.$^7$ .................................................. A47F 5/00
(52) U.S. Cl. ......................... 211/183; 211/26; 312/263
(58) Field of Search ............... 211/26, 183; 312/223.2, 312/263; 248/615, 912; 361/724, 683

(56) References Cited

U.S. PATENT DOCUMENTS

| | | | | |
|---|---|---|---|---|
| 918,039 A | * | 4/1909 | Grundmann | 182/178.3 |
| 3,379,483 A | * | 4/1968 | Oldford | 312/263 |
| 3,380,111 A | * | 4/1968 | G. J. F. Hård AF Segerstad | 16/87.4 R |
| 3,784,273 A | * | 1/1974 | Nikolai | 312/265.3 |
| 3,849,954 A | * | 11/1974 | Sugita | 52/235 |
| 3,860,999 A | * | 1/1975 | Meyer | 411/349 |
| 4,017,134 A | * | 4/1977 | Lenglin et al. | 312/351 |
| 4,226,488 A | * | 10/1980 | Vincent | 312/317.1 |
| 4,464,084 A | * | 8/1984 | Wozniak | 405/151 |
| 4,471,898 A | * | 9/1984 | Parker | 228/20.5 |
| 4,914,874 A | * | 4/1990 | Graham, Jr. | 217/43 A |
| 5,212,924 A | * | 5/1993 | Finkelstein | 52/127.9 |
| 5,248,193 A | * | 9/1993 | Schlemmer | 312/223.2 |
| 5,312,005 A | | 5/1994 | Odell | 211/189 |
| 5,445,362 A | * | 8/1995 | Reppert | 256/24 |
| 5,450,285 A | * | 9/1995 | Schlemmer | 361/724 |
| 5,502,930 A | * | 4/1996 | Burkette et al. | 16/225 |
| 5,587,877 A | * | 12/1996 | Ryan et al. | 361/683 |
| 5,902,025 A | * | 5/1999 | Yu | 312/109 |
| 5,971,507 A | | 10/1999 | Peroni | 312/233.2 |
| 5,992,808 A | | 11/1999 | Morrow | 248/222.52 |
| 6,006,692 A | * | 12/1999 | Szukhent, Jr. | 114/361 |
| 6,102,501 A | * | 8/2000 | Chen et al. | 312/223.2 |
| 6,179,267 B1 | * | 1/2001 | Johnston | 248/225.11 |
| 6,279,754 B1 | * | 8/2001 | Hoss et al. | 211/26 |
| 6,317,348 B1 | * | 11/2001 | Vackar | 363/144 |

\* cited by examiner

Primary Examiner—Daniel P. Stodola
Assistant Examiner—Khoa Tran
(74) Attorney, Agent, or Firm—Lumen Intellectual Property Services, Inc.

(57) ABSTRACT

A blank panel for use with rack units. The blank panel comprises at least one face plate having a rectangular front plate surface, a back plate surface, top plate surface, bottom plate surface and two side plate surfaces. The face plate has a height corresponding to multiples of 1.75 inches. The face plate incorporates at least one recess for slidably receiving fasteners. The blank panel further comprises fasteners with mating portions for being slidably engaged with the face plate, and fastening portions for being further attachable to a rack unit. The fasteners have varied geometry to accommodate rack units with alternate configurations. The blank panel further comprises a plurality of face plates attached along the top and bottom plate surfaces. Each of the face plates is capable of individually receiving fasteners. The individual face plates of the blank panel are also modular and can be separated to configure the blank panel to varied height requirements.

3 Claims, 7 Drawing Sheets

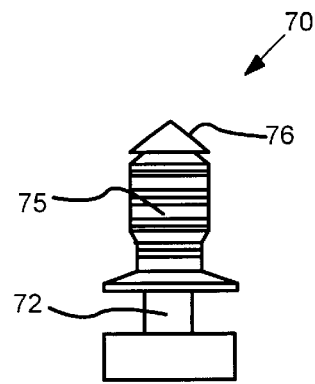
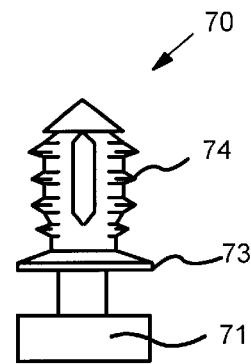
FIG. 7A  FIG. 7B
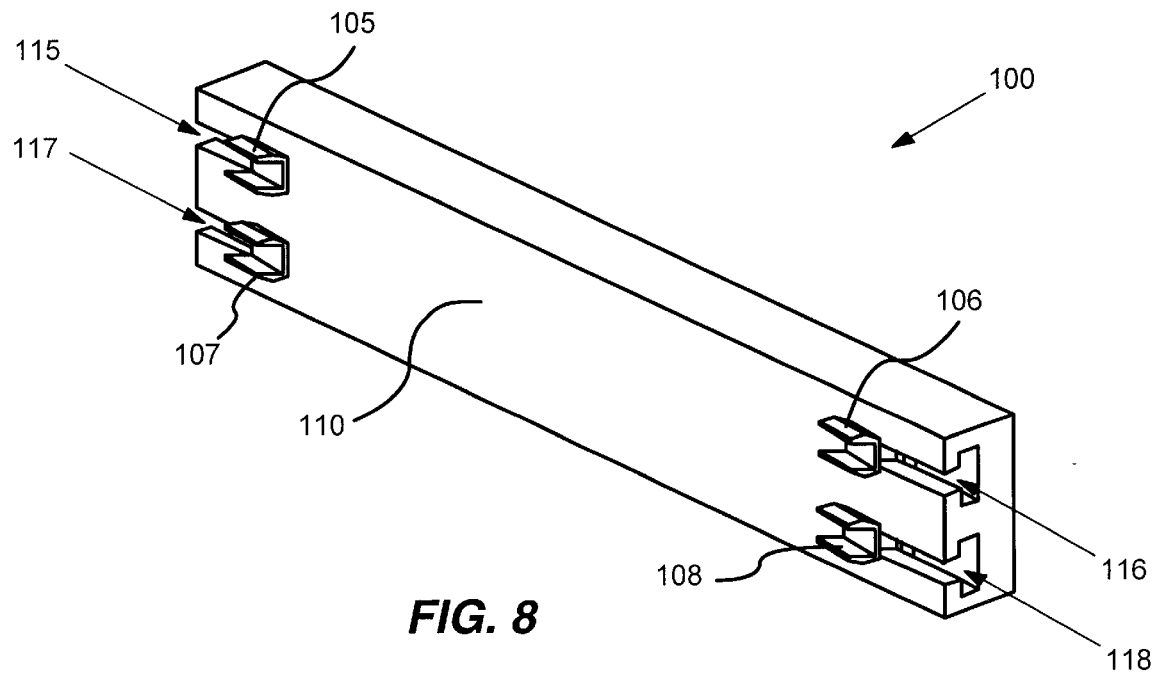
FIG. 8

BLANK PANEL FOR RACK UNITS

FIELD OF THE INVENTION

This invention relates generally to panels for use with rack units. More particularly, this invention relates to blank panels comprised of face plates and means for attachment to open and enclosed electronic rack units.

BACKGROUND ART

Known blank panels for use with electronic rack units are typically composed of face plates having a rectangular cross section with elongated holes positioned in proximity to the outer edges for receiving fasteners to facilitate attachment to rack units. The face plates and associated holes are dimensionally sized and configured to standards set by the Electronic Industries Association (EIA). In EIA Standard RS-310-C the dimensional standards for racks, panels, and associated equipment are specified. Three cabinet and rack widths to accommodate each of three standard panel widths, 19", 24", and 30" are covered by this Standard. 19" is the preferred width. Panel height is defined by the Standard in multiples of Rack Units (RU's). One Rack Unit is defined as 1.75".

Blank panels are typically employed on rack units for either aesthetic or enclosure purposes. A blank panel is often used to keep contaminants (such as dust) out of a rack unit and away from sensitive equipment. Rack units also often employ forced or drawn air ventilation systems to cool components. These systems require a substantially closed system to maintain proper convection flows. Open panels on the front of rack units compromise the effectiveness of these systems. Blank panels are often used to cover vacancies in the front of such rack units.

Blank panels are used extensively in conjunction with various types of rack units. Specific terminology extends to blank plates, blank panels, and face plates among others. Blank panels, as used in the electronics industry, are generally comprised of metal, typically steel or aluminum.

For examples of prior art panels and their methods of attachment to rack units see Peroni in U.S. Pat. No. 5,971,507 and Odell in U.S. Pat. No. 5,312,005. The devices disclosed do not illustrate a novel means for attaching panels to a rack unit. The references employ standard elongated orifices positioned near the ends of the panel to accept threaded fasteners. In U.S. Pat. No. 5,992,808 Morrow teaches the use of a "key" for attaching electronic components and panels to rack units. The key has a geometry so as to be insertable through openings on the periphery of a panel, and subsequently through corresponding openings in a rack unit. On rotating the key through 90 degrees the key locks in position, thus securing the panel in place. This method for attaching panels to rack units offers the advantage of not requiring special tools, however, it also requires that the rack unit be modified to lock the keys in the rotated position. A further shortcoming is inherent in the shear number of individual keys required to attach a single panel to a rack unit, such loose parts are both cumbersome and at risk for loss.

References in the prior art do not discuss a means for directly incorporating fasteners with blank panels. The references also generally require special tools to operate the fasteners which they employ. Further, the prior art does not overcome the limitation of an individual blank panel not being adaptable to accommodate various height requirements.

What is needed is a blank panel that is attachable to racking units in a secure manner, which employs fasteners that do not require the use of special tools or equipment. The fasteners should be easy to replace and accommodate various rack configurations. The blank panel needs to be functional, light weight, modular and versatile. The blank panel should conform to recognized standards for racks, panels, and associated equipment. It would also be useful if the blank panel could be modified to accommodate varied height requirements.

OBJECTS AND ADVANTAGES

Accordingly, it is a primary object of the present invention to provide a blank panel that can be securely attached to electronic component rack units.

It is a further object of the invention to provide a blank panel for rack units that is attachable without the use of special tools.

It is a further object of the invention to provide a blank panel for electronic component rack units comprising at least one face plate with means for slidably receiving fasteners.

It is a further object of the invention to provide a blank panel for electronic component rack units, wherein the blank panel comprises a plurality of face plates capable of covering multiple adjacent openings.

It is a further object of the invention to provide a blank panel for electronic component rack units incorporating a plurality of face plates, wherein individual face plates of the blank panel are modular and can be separated to configure the blank panel to varied height requirements.

SUMMARY

The objects and advantages of the invention are accomplished by a blank panel that is configured to be attachable to a rack unit. The blank panel generally comprises at least one face plate having a substantially rectangular front plate surface, a back plate surface, top plate surface, bottom plate surface and two side plate surfaces. The face plate has a height corresponding to multiples of 1.75 inches. The face plate is capable of slidably receiving fasteners for being further attached to an electronic component rack unit.

Fasteners are incorporated to mate with the face plate of the blank panel and be attachable to electronic component rack units. Fasteners of varied geometry are disclosed to accommodate electronic component rack units with alternate configurations.

In a preferred embodiment of the invention, the blank panel is comprised of a plurality of face plates attached along their length with means for being further attached to an electronic component rack unit.

In a further preferred embodiment of the invention, the blank panel is comprised of a plurality of face plates attached along the top and bottom plate surfaces. The face plates have means for slidably receiving fasteners. The blank panel further comprises fasteners engaged with the face plates. The plurality of face plates act as an individual blank panel spanning multiple Rack Units in height.

In a more preferred embodiment, the blank panel is comprised of a plurality of face plates attached along the top and bottom plate surfaces, having means for being attached to a rack unit, wherein the individual face plates of the blank panel are separable at the intersection between face plates. Thus the face plate components of the blank panel are separable to form subsequent blank panels comprised of a reduced number of face plates.

The components of the blank panel are preferably constructed of a polymer for light weight and durability, but may alternatively be made of metal or other material.

BRIEF DESCRIPTION OF THE FIGURES

FIGS. 7A–B are corresponding views of a fastener having a ribbed profile.

FIG. 8 is an illustration of a blank panel as described by the invention incorporating fasteners with a face plate.

DETAILED DESCRIPTION

Figure 1:
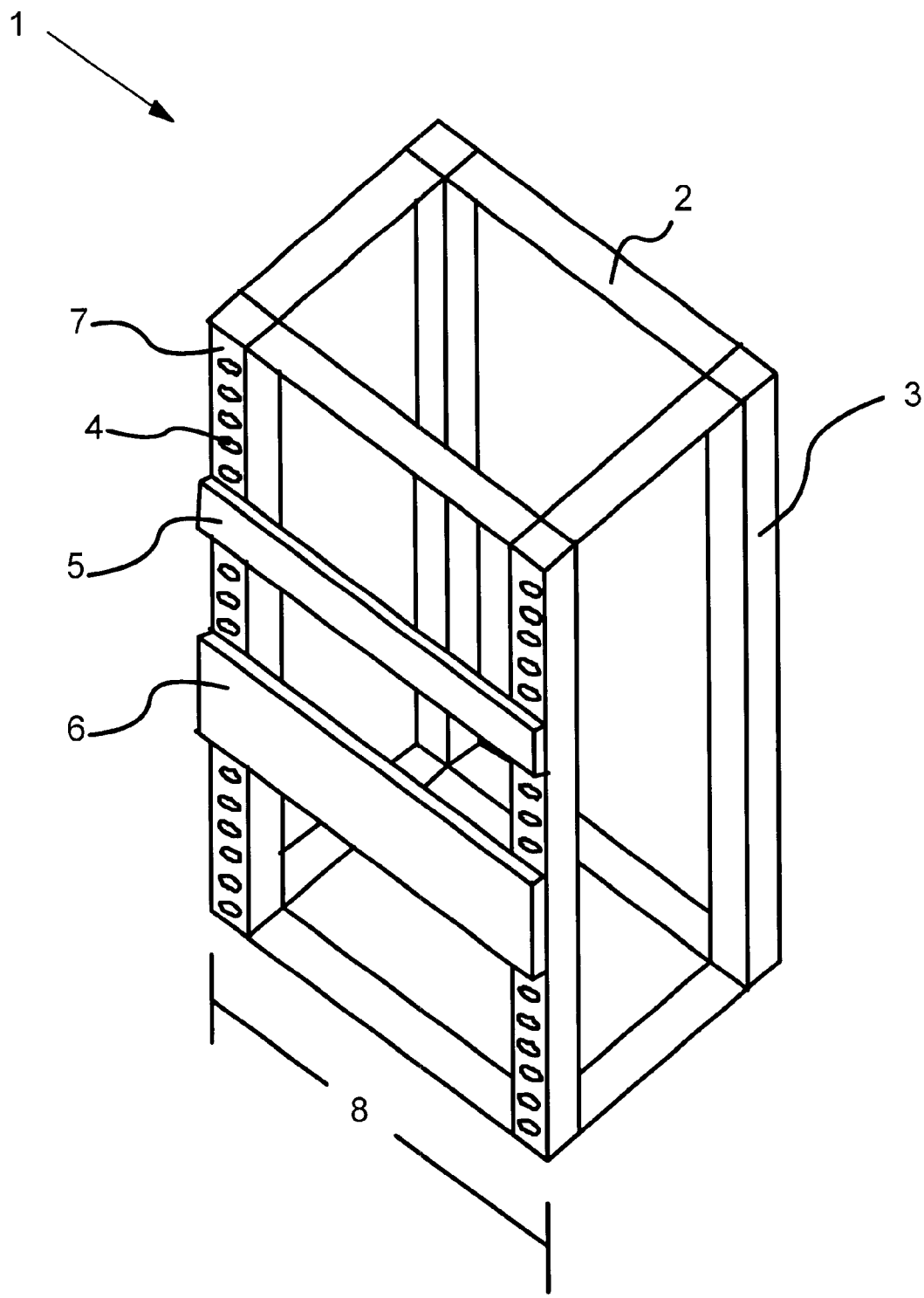
FIG. 1 illustrates the basic use of blank panels with a rack unit.

FIG. 1 displays the general use of blank panels with a rack unit similar to what could be used for housing electronic components. Rack unit 1 represents a basic rack comprised of horizontal structural supports 2 and vertical mounting bars 3. Orifice holes 4 are arranged along front surface 7 of vertical mounting bars 3. Blank panels 5 and 6 are affixed to rack unit 1 with fasteners (not shown) attached to orifice holes 4 along front surface 7 of vertical mounting bars 3. Blank panels 5 and 6 have length 8 conforming to the span between the outside edges of vertical mounting bars 3 across the front of rack unit 1. Blank panels 5 and 6 further illustrate blank panels having different heights.

The generally accepted industry standard for electronic rack units, panels, and associated equipment is published by the Electronic Industry Association (EIA). EIA Standard RS-310-C specifies the dimensional standards for racks, panels, and associated equipment. Three cabinet and rack widths to accommodate each of three standard panel widths, 19", 24", and 30" are covered by this Standard. 19" is the preferred width. Panel height is defined by the Standard in multiples of Rack Units (RU's). One Rack Unit is defined as 1.75".

Figure 2A:
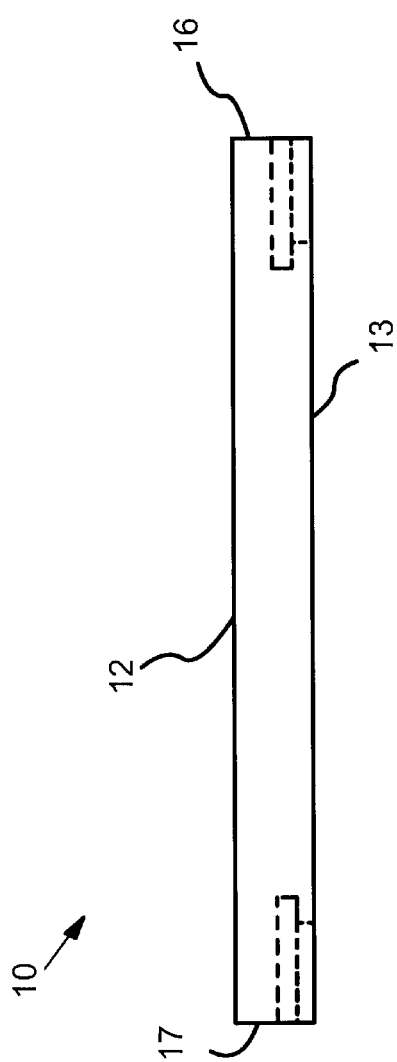
FIGS. 2A–C are corresponding views of a face plate as described by the invention.
Figure 2B:
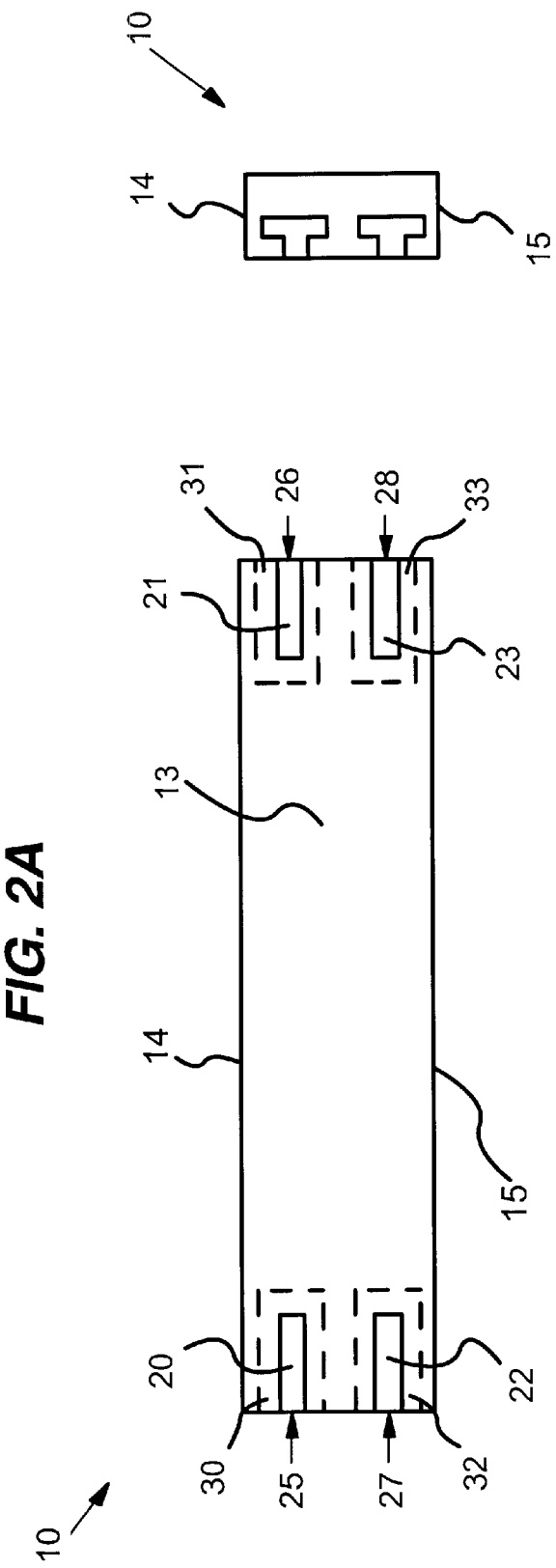
Figure 2C:

Corresponding views of a face plate as described in the blank panel of the invention are illustrated in FIGS. 2A–C. FIG. 2A displays face plate 10 from a top view, FIG. 2B is a rear view, and FIG. 2C a side view. Face plate 10 is comprised of a substantially rectangular front plate surface 12, a back plate surface 13, top plate surface 14, bottom plate surface 15 and two side plate surfaces 16, 17 and further includes recesses 20, 21, 22, 23. Recesses 20, 21, 22, 23 are recessed within face plate 10 from back plate surface 13 with openings along side plate surfaces 16, 17 and back plate surface 13. Recesses 20, 21, 22, 23 further comprise channels 25, 26, 27, 28 within face plate 10, whereby overhang extensions 30, 31, 32, 33, extending from back plate surface 13, partially cover recesses 20, 21, 22, 23. In a preferred embodiment of the invention channels 25, 26, 27, 28, formed within recesses 20, 21, 22, 23, provide means for slidably receiving fasteners.

It may be desirable to incorporate a design or logo on a face plate of a blank panel for esthetic or branding purposes. Therefore, in a preferred embodiment of the invention a logo may be added to, or incorporated into, face plate 10.

Figure 3:
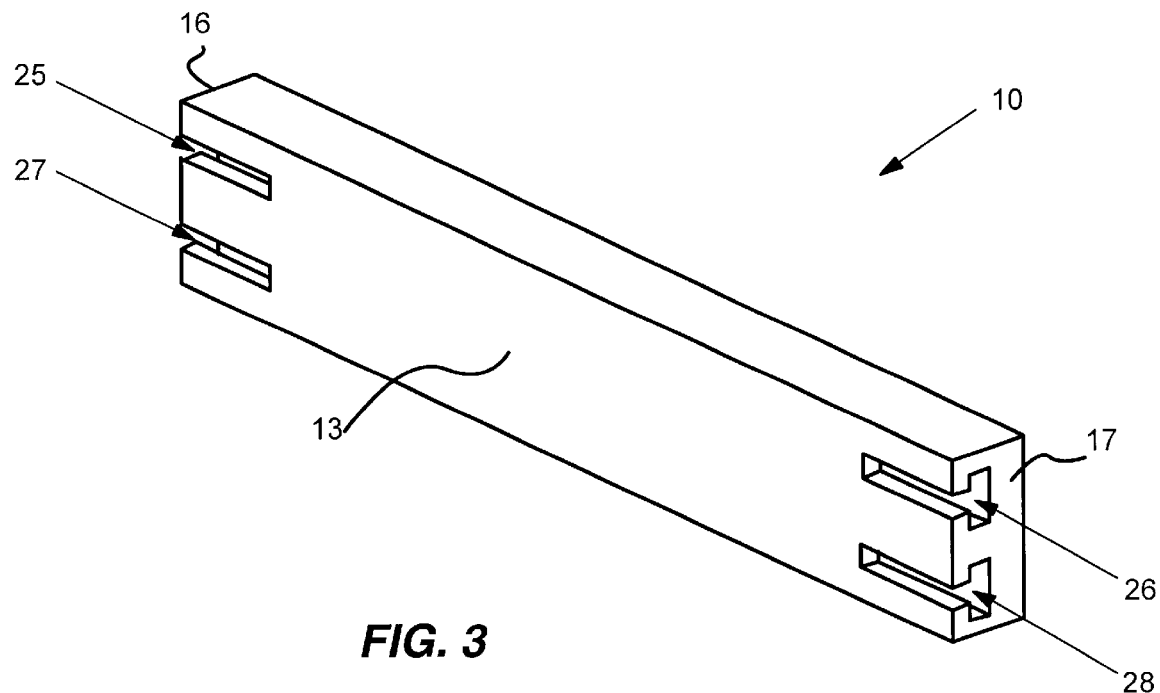
FIG. 3 is an isometric view of a face plate with horizontal channels.

FIG. 3 displays an isometric view of the face plate 10 previously illustrated in FIGS. 2A–C. FIG. 3 further illustrates channels 25, 26, 27, 28 formed within face plate 10 with openings along side plate surfaces 16, 17 and back plate surface 13. In a preferred embodiment of the invention fasteners are slidably engaged in the channels of face plate 10. The fasteners shall have a mating portion for being engaged within such channels. The fastener should also comprise an attachment portion which extends from the face plate normal to the back plate surface. This attachment portion should have a geometry suitable for attaching to an electronic component rack unit, thus facilitating attachment of the face plate to an electronic component rack unit.

Figure 4:
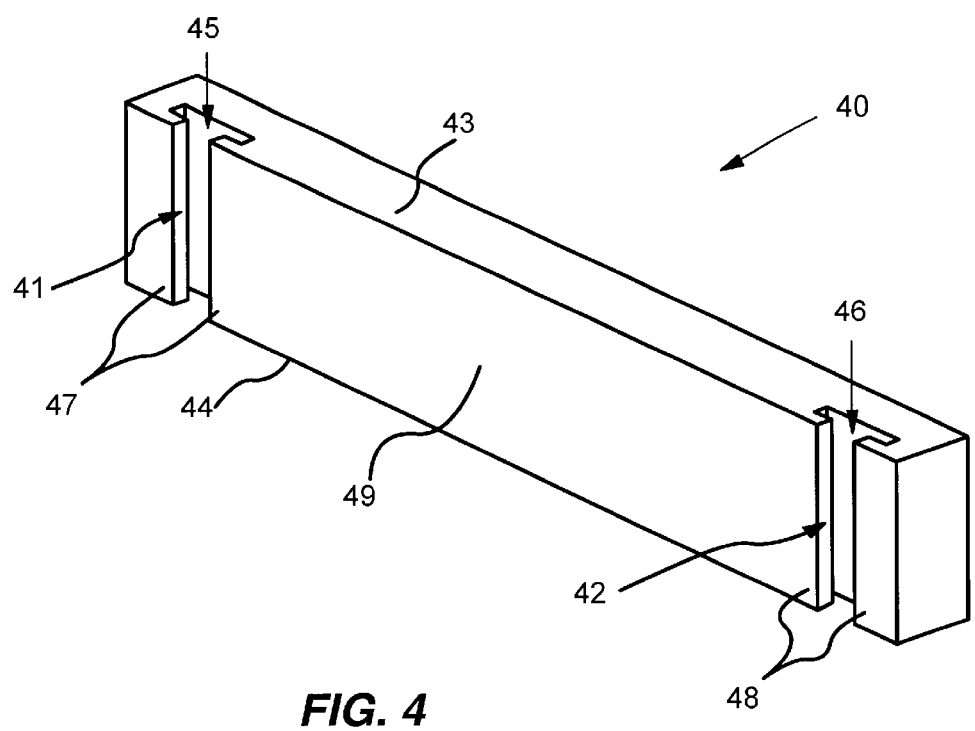
FIG. 4 is an isometric view of a face plate with vertical channels.

FIG. 4 displays an alternate recess configuration to that of face plate 10 of FIG. 3 and is similarly labeled. Face plate 40 alternately comprises vertical recesses 41, 42 with openings along top plate surface 43, bottom plate surface 44, and back plate surface 49. Recesses 41, 42 further comprise channels 45, 46 within face plate 40, having overhang extensions 47, 48 extending from back plate surface 49 partially covering recesses 41, 42. In a preferred embodiment, channels 45, 46 slidably receive fasteners such that face plate 40 is further attachable to an electronic component rack unit.

Figure 5:
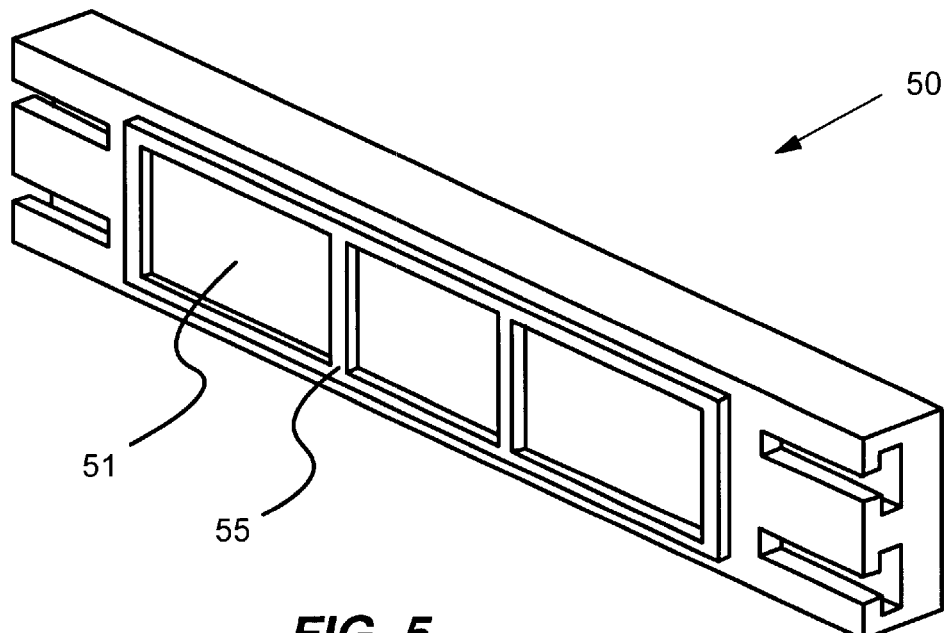
FIG. 5 is an isometric view of a face plate illustrating structural bracing members.

FIG. 5 is an isometric view of structural bracing member 55 attached to face plate 50 along back plate surface 51. Bracing member 55 provides additional strength and stability to face plate 50.

Figure 6A:
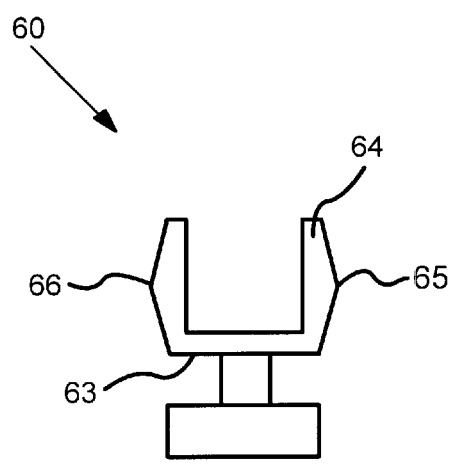
FIGS. 6A–B are corresponding views of a fastener having a U-shaped profile.
Figure 6B:
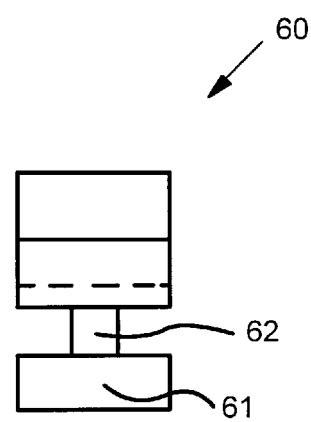

A fastener is illustrated in FIGS. 6A–B. Fastener 60 comprises a base 61, clip 64, and column 62 for connecting base 61 to clip 64. Clip 64 has a U-shaped profile when viewed from the front, with bottom 63 attached to column 62, and protrusions 65, 66 extending outward, normal to the side panels of the U-shaped cross section. In a preferred embodiment, fastener 60 will be slidably receivable by face plate 10 as described in FIGS. 2A–C. Base 61 will comprise a mating portion having geometry for being slidably engaged in channels 25, 26, 27, 28, and column 62 will have geometry to be received within recesses 20, 21, 22, 23 within overhang extensions 30, 31, 32, 33 of face plate 10. Protrusions 65, 66 of clip 64 provide fastening portions for attachment to an electronic component rack unit. Thus the fastener can be used to attach a face plate to a rack unit. In a further preferred embodiment the fasteners may be slidably engaged, and subsequently disengaged, from a face plate. The fasteners should be comprised of a durable and versatile material such as a metal or polymer.

FIGS. 7A–B illustrate a fastener with an alternate design to that of FIGS. 6A–B. Fastener 70 comprises a base 71, clip 75, and column 72 for connecting base 71 to clip 75. Bottom 73 of clip 75 connects to column 72. Cone 76 is positioned at the top of clip 75. Clip 75, cone 76, and bottom 73 have substantially circular cross sections when viewed from the top. Ribbed protrusions 74 extend outward from clip 75 normal to the central axis of clip 75. In a preferred embodiment, fastener 70 will be slidably receivable by face plate 10 as described in FIGS. 2A–C. Base 71 will comprise a mating portion having geometry for being slidably engaged in channels 25, 26, 27, 28, and column 72 will have geometry to be received within recesses 20, 21, 22, 23 within overhang extensions 30, 31, 32, 33 of face plate 10. Ribbed protrusions 74 of clip 75 provide fastening portions for attachment to a rack unit. Thus one skilled in the art will recognize that when the one or more fasteners are attached to a face plate, the face plate will be further attachable to an electronic component rack unit. In a further preferred embodiment the fasteners may be slidably engaged, and subsequently disengaged, from a face plate. The fasteners should be comprised of a material such as a metal or polymer.

FIG. 8 illustrates a preferred embodiment of the invention whereby a fastener, such as that disclosed in FIGS. 6A–B, is engaged with a face plate such as that displayed in FIG. 3. In this preferred embodiment of the invention, blank panel 100 is comprised of fasteners 105, 106, 107, 108 slidably engaged into channels 115, 116, 117, 118 of face plate 110. Fasteners 105, 106, 107, 108 have a mating portion for being engaged within such channels, and an attachment portion which extends from face plate 110 normal to the back plate surface. This attachment portion has geometry suitable for attaching to a rack unit, thus facilitating attachment of face plate 110 to an electronic component rack unit.

The face plate and fasteners of the blank panel should be constructed of light weight, durable and versatile materials such as, but not limited to, metals and polymers. Processes such as stamping, extrusion, and injection molding could be employed to inexpensively produce these components in large quantities.

Figure 9:
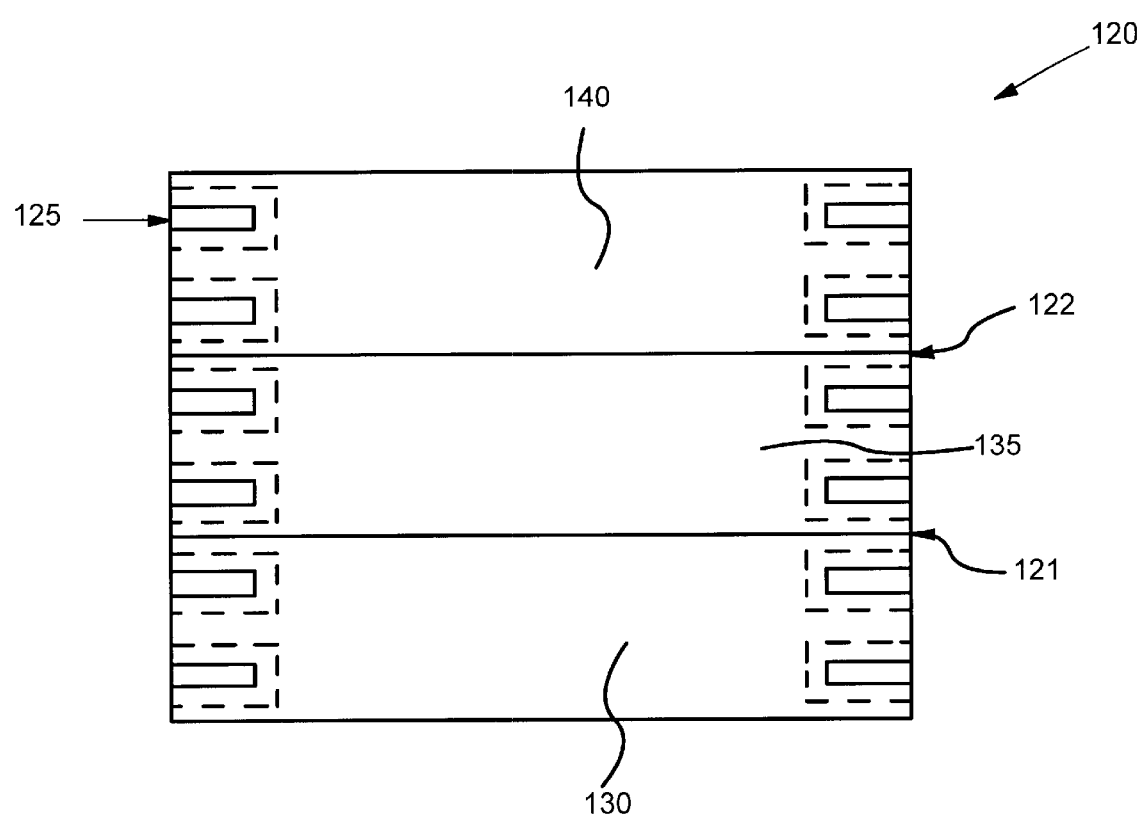
FIG. 9 illustrates a blank panel comprised of a plurality of face plates.

A blank panel comprised of a plurality of face plates as described by the invention is illustrated in FIG. 9. Blank panel 120 is comprised of a plurality of face plates 130, 135, 140 attached within a geometric plane along intersections 121, 122. Face plates 130, 135, 140 further comprise recessed channels 125. In a preferred embodiment of the invention, the blank panel is comprised of a plurality of two or more face plates attached along their length as shown.

In a further preferred embodiment of the invention, the face plates of the blank panel incorporate means for being attachable to an electronic component rack unit. Such means may include fasteners slidably engaged within channels 125, or alternate methods.

In a more preferred embodiment of the invention, blank panel 120 is comprised of a plurality of face plates 130, 135, 140 attached along intersections 121, 122, wherein face plates 130, 135, 140 are further independently separable from blank panel 120 along intersections 121, 122. Thus the face plate components of the blank panel are separable to form subsequent blank panels comprised of a reduced number of face plates. One skilled in the art will recognized that the subsequent blank panels formed by separating one or more of the face plates will retain the same total number of face plates. It should also be obvious to one skilled in the art that subsequent blank panels may include any multiple of face plates originally comprised from the root blank panel. As a specific example, if a root blank panel comprises a plurality of 4 face plates attached along their length within a geometric plane, subsequent blank panels may contain 1, 2, or 3 face plates attached along their length.

Figure 10:
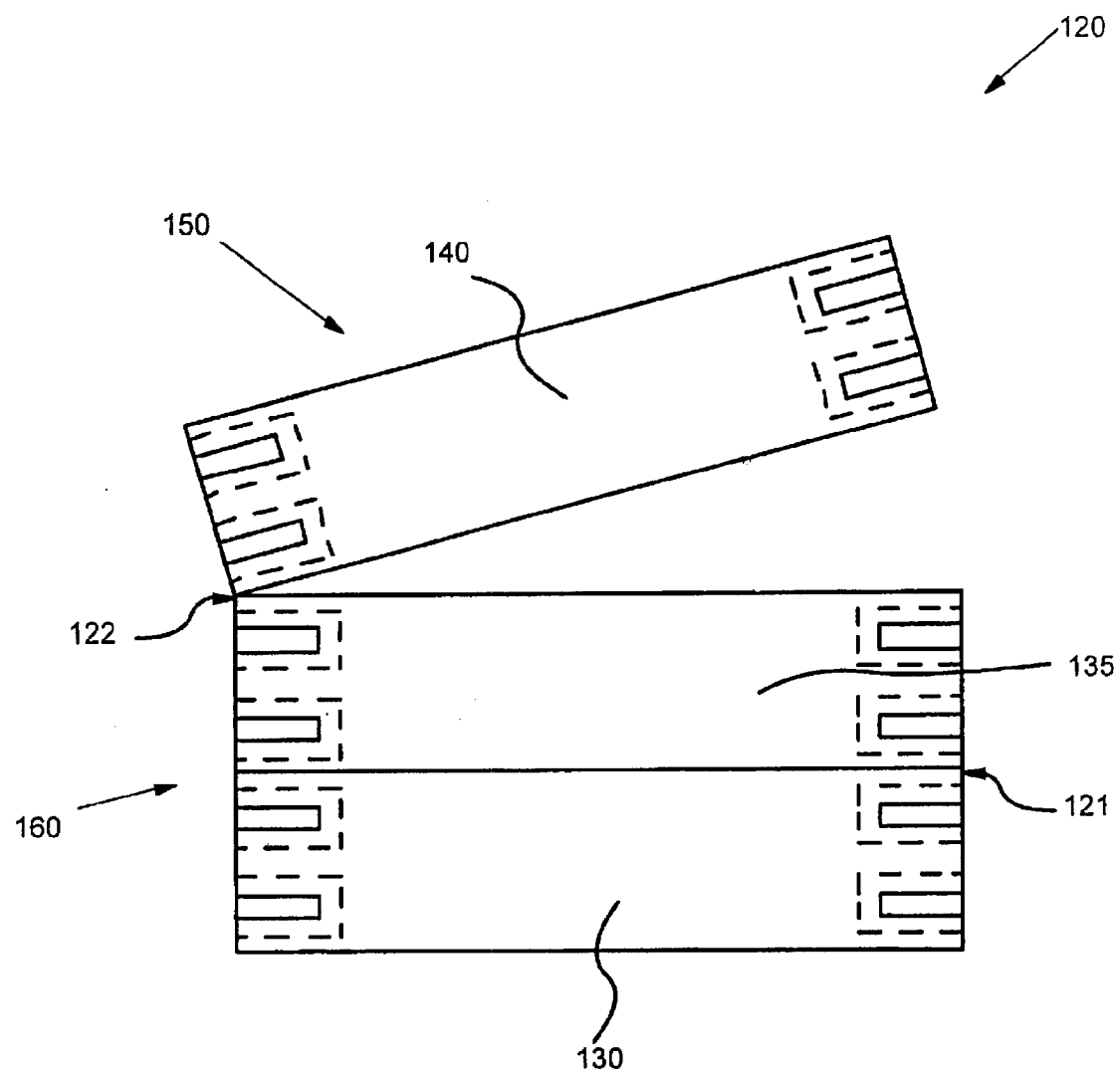
FIG. 10 illustrates a blank panel comprised of a plurality of face plates, separated to form 2 blank panels.

FIG. 10 further describes the blank panel as described by the invention and illustrated in FIG. 9. Similar labeling to FIG. 9 has been incorporated in FIG. 10. Blank panel 120 is comprised of the plurality of face plates 130, 135, 140. Face plates 130, 135, 140 further comprise recessed channels 125.

Face plates 130 and 135 are attached within a geometric plane along intersection 121. Face plate 140 has been separated from face plate 135 along intersection 122. Face plate 140 thus now comprises new blank panel 150, and face plates 130, 135 now comprise new blank panel 160.

For a specific example of a modular blank panel as described by the invention, a root blank panel may be taken to comprise 3 face plates of similar geometry. In this example we may assume that each face plate has a height equal to 1.75 inches, thus the root blank panel would have a total height of 5.25 inches. As in the case illustrated by FIG. 10, where one face plate is separated from the root blank panel, the newly formed blank panels will have heights of 1.75 inches and 3.5 inches respectively.

It will be clear to one skilled in the art that the above embodiments may be altered in many ways without departing from the scope of the invention. For example, the orientation and placement of channels and fasteners within a face plate may be altered or repositioned. The height and number of face plates used in a blank panel will also be based on the specific application and designers preference. Accordingly, the scope of the invention should be determined by the following claims and their legal equivalents.

What is claimed is:

1. A blank panel for use with an electronic component rack unit, said blank panel comprising at least one face plate having two side plate surfaces, a back plate surface with structural bracing members, wherein said face plate has means for exchangably and slidably receiving a mating portion of a fastener for attaching said face late with an attachment portion of said fastener to an orifice hole of a mounting bar of said rack unit irrespective of alternate configurations of said rack unit such that said face plate is contacting with said back plate surface said mounting bar, wherein said means comprises a recess recessing with finite length from said back plate surface into said face late and an overhang extension partially covering said recess such that said means is accessible to said fastener from a side plate surface of said face plate.

2. The blank panel of claim 1, wherein said blank panel comprises at least two face plates, a first face plate and a second face plate, wherein said second face plate is separable attached to said first face plate along a bottom plate surface of said second face plate and a top plate surface of said first face plate.

3. A blank panel comprised of a plurality of face plates including front plate surfaces, back plate surfaces, top plate surfaces, bottom plate surfaces, wherein said plurality of face plates are separable attached along a geometric place defined by one of said top plate surfaces of a first of said plurality of face plates and defined by one of said bottom plate surfaces of a second of said plurality of face plates adjacent to said first face plate and wherein at least one of said plurality of said face plates having tow side plate surfaces and a back plate surface, wherein said face plate has means for exchangably and slidably receiving a mating portion of a fastener for attaching said face plate with an attachment portion of said fastener to an orifice hole of a mounting bar of said rack unit irrespective of alternate configurations of said rack unit such that said face plate is contacting with said back plate surface said mounting bar, wherein said means comprises a recess recessing from said back plate surface into said face plate and fan overhang extension partially covering said recess such that said means is accessible to said fastener from a side plate surface of said face plate.

* * * * *